United States Patent [19]

Uchida

[11] Patent Number: 4,814,853
[45] Date of Patent: Mar. 21, 1989

[54] SEMICONDUCTOR DEVICE WITH PROGRAMMABLE FUSE

[75] Inventor: Yukimasa Uchida, Yokohama, Japan

[73] Assignee: Tokyo Shibaura Denki Kabushiki Kaisha, Kawasaki, Japan

[21] Appl. No.: 428,614

[22] Filed: Sep. 30, 1982

[30] Foreign Application Priority Data

Oct. 28, 1981 [JP] Japan ................................. 56-172539
Oct. 28, 1981 [JP] Japan ................................. 56-172540
Oct. 28, 1981 [JP] Japan ................................. 56-172541

[51] Int. Cl.⁴ ........................................... H01L 27/02
[52] U.S. Cl. ...................................... 357/51; 357/28; 357/59; 357/61; 357/67
[58] Field of Search ..................... 357/28, 675, 51, 61, 357/59

[56] References Cited

U.S. PATENT DOCUMENTS

| | | | |
|---|---|---|---|
| 3,641,516 | 6/1972 | Castrucci et al. | |
| 3,699,395 | 10/1972 | Boleky | 357/67 X |
| 3,699,403 | 10/1972 | Boleky, III | 357/51 X |
| 3,778,886 | 2/1973 | Shields et al. | |
| 3,792,319 | 2/1974 | Tsang | 357/59 X |
| 3,971,056 | 7/1976 | Jaskolski et al. | 357/28 |
| 4,042,950 | 8/1977 | Price | 357/61 X |

FOREIGN PATENT DOCUMENTS 54-88783 7/1979 Japan ................................. 357/675
56-83073 7/1981 Japan ................................. 357/675

OTHER PUBLICATIONS

Lloyd et al., "Polysilicon Fuse," *IBM Technical Disclosure Bulletin*, vol. 24, No. 7A, Dec. 1981, p. 3442.
RCA Technical Notes, No. 976, pp. 1 and 2, Sept. 17, 1974, Princeton, N.J.
Patents Abstracts of Japan, vol. 5, No. 66(E-55) [738], May 2, 1981.

*Primary Examiner*—Andrew J. James
*Assistant Examiner*—William A. Mintel
*Attorney, Agent, or Firm*—Cushman, Darby & Cushman

[57] ABSTRACT

A first wiring layer is formed on a substrate. An insulation layer is formed on the first wiring layer so as to cover with the first wiring layer. A second wiring layer, which acts as a fuse device, is formed on the insulation layer transverse to the first wiring layer. A programming current is directed through the first wiring layer under the second wiring layer which is to be programmed. The heat generated by the programming current is transmitted through the insulation layer to the portion of the second wiring layer which crosses the first wiring layer. As a result, the second wiring layer is melted by the heat and thus disconnected. Alternatively, the heat may form a eutectic mixture with the material of the second wiring layer and a third wiring layer, which is formed on the second wiring layer, to complete the continuity of the second wiring layer.

23 Claims, 7 Drawing Sheets

SEMICONDUCTOR DEVICE WITH PROGRAMMABLE FUSE

BACKGROUND OF THE INVENTION

1. Field of the Invention

This invention relates to semiconductor devices and more particularly to such devices requiring programming (such as programmable read-only memory elements (PROM elements)) or incorporating redundant circuitry.

2. Prior Art

Demand for PROM elements, particularly in semiconductor large scale integrated (LSI) circuits has increased dramatically recently. The PROM element is used not only in LSI PROM elements but also in other LSI memories and LSI logic circuitry with redundant circuitry (fault-tolerant circuitry).

PROM elements may be programmed by any of the following techniques:

1. PN junction shorting technique, in which the PN junction is shorted by passing excessive current therethrough to accomplish the programming.

2. Current fuse programming technique as disclosed in U.S. Pat. No. 3,792,319 to Tsang. A fuse element is dissolved by heat generated from current passing therethrough to accomplish programming.

3. Laser fuse programming technique in which the fuse device is disconnected by employing an irradiating laser to write data.

The first and second techniques require a very large current to program the data. For example, a programming current value of about 100 mA is required for the first technique, and the programming current for the second technique is about 50 mA. A bipolar transistor having a large amplification is needed to generate such a large current. When these programming techniques are applied to devices using MOS transistors, the MOS transistors for generating such large currents require a very large channel width. Large areas in MOS.LSI.-PROM are occupied by such MOS transistors. Therefore, it is difficult to fabricate LSI PROM with high component densities by the first and second techniques.

In the third technique, irradiation must occur very close to the active element. Very expensive equipment is required for automatically and accurately determining the irradiating position.

Figure 1:
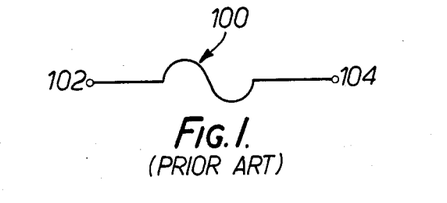
FIG. 1 is an equivalent circuit of a conventional current fuse programming technique.
Figure 2:
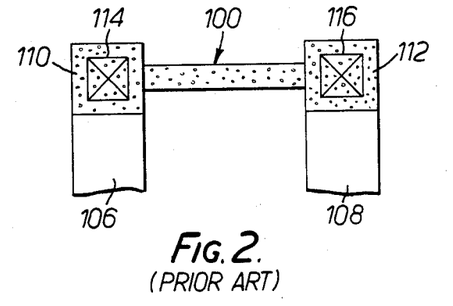
FIG. 2 is a top plan view of a conventional current fuse.

FIGS. 1 and 2 show a conventional fuse element of the second, current fuse technique, FIG. 1 being an equivalent circuit and FIG. 2 being a top plan view. In FIG. 1, the fuse element 100 is melted by passing current between terminals 102 and 104. In FIG. 2, fuse 100 is formed of a polysilicon layer. Aluminum wiring layers 106 an 108 are connected to fuse element 100 at terminals 110 and 112 through contact holes 114 and 116. These contact holes have a width greater than fuse element 100.

In this current fuse technique a few problems exist in addition to the difficulty of high packing density aforementioned. First, the melting mechanism is difficult to control. The necessary programming current varies from one device to the next. Second, elements near the fuse device may be damaged by the heat when the fuse is melted by the current. Third, the reliability of the fuse devices is low, because the fuse device is not covered with a passivation layer (protecting layer).

BRIEF SUMMARY OF THE INVENTION

An object of this invention is to provide a PROM device with a programmable fuse, wherein the programmable fuse is disconnected or connected by a small current.

A further object of this invention is to provide a PROM device with a high component density.

A still further object of this invention is to provide a PROM device, which is superior in reliability and flexibility of design.

In order to achieve the above objects, a first wiring layer is provided for generating heat by passing a current therein. An insulation layer covers the first wiring layer. A second wiring layer is formed on the insulation layer which is electrically connected or disconnected by the heat which passes through the insulation layer.

BRIEF DESCRIPTION OF THE DRAWINGS

Other objects and advantages of the invention will become apparent from the following detailed description when taken in conjunction with the accompanying drawings, in which.

DETAILED DESCRIPTION OF THE INVENTION

The present invention may be applied to any semiconductor programmable circuit array on a common substrate, whether such circuit is made of MOS, linear analog, bipolar or any other type of device. However, for purpose of explanation, the present invention will be described with reference to a particular semiconductor device. Thus, in the discussion to follow, one particular semiconductor device is described in detail in regard to the construction, programming, circuitry and operation thereof, it being understood that the present invention is not to be limited to the specific embodiment described.

Figure 3:
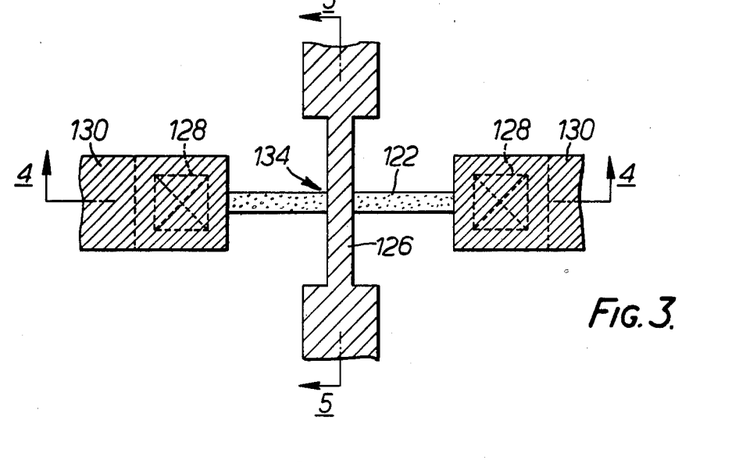
FIG. 3 is a fragmentary top view illustrating a first embodiment of the present invention.
Figure 4:
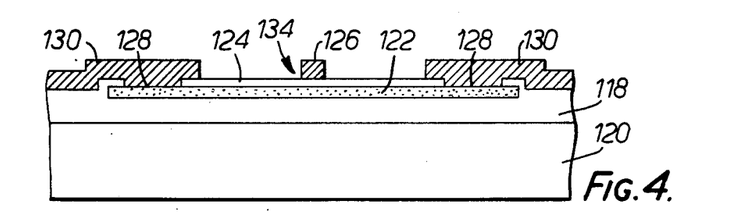
FIG. 4 is a sectional view taken along the 4—4 line in FIG. 3.
Figure 5:
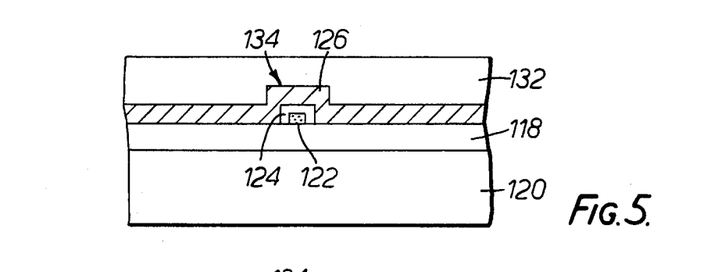
FIG. 5 is a sectional view taken along the 5—5 line in FIG. 3.

A first embodiment will now be explained in accordance with FIGS. 3-9. As shown in FIGS. 3-5, an insulation layer 118 consisting of $SiO_2$ or $Si_3N_4$ is formed on is substrate 120. A first wiring layer 122, made of low resistive polycrystalline silicon having an $N^+$ or $P^+$ conductivity type and a thickness of about 5000 Angstroms, is formed on insulation layer 118. Alternatively, first wiring layer 122 may be made of a metal such as Mo, Pt, W, Ti, Ta having a high melting point, the silicide thereof or a single crystalline silicon having an $N^+$ or $P^{++}$ conductivity type. An insulation layer 124 consisting of $SiO_2$, $Si_3N_4$ or a double layer of $SiO_2$ and $Si_3N_4$ is formed on first wiring layer 122. The thickness of insulation layer 124 may preferably be between 200 and 800 Angstroms. Second wiring layer 126 consisting of aluminum (Al) is formed (by deposition or the like) with a thickness of about 8000 Angstroms on insulation layer 124 so as to cross first wiring layer 122. Terminal regions 128 are formed at the ends of first wiring layer 122, and are connected to aluminum wiring layers 130. Aluminum wiring layers 130 are used to conduct a programming current to first wiring layer 122. The programmable fuse device is covered with a passivation layer (protecting layer) 132 of one micron thickness.

Figure 6:
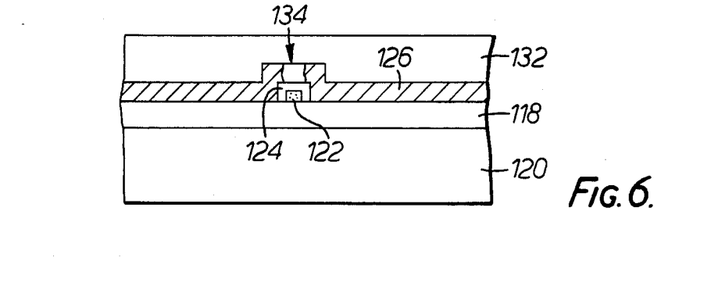
FIG. 6 is a sectional view similar to FIG. 5 illustrating the first embodiment of the present invention after programming.

The programming operation of the above described programmable fuse device is as follows. As shown in FIG. 5 and FIG. 6, the fuse device is programmed by passing several mA of current through first wiring layer 122. The programming current is pulse wave current or DC. The current through first wiring layer 122 generates heat so that in this sense first wiring layer 122 is a heater. The heat that is generated reaches second wiring layer 126 on crossing portion 134 through insulation layer 124. The melting point of second wiring layer 126 is 660° C. in case of aluminum, which is less than that of first wiring layer 122, 1420° C. in case of polysilicon. Accordingly, the amount of current which flows through first wiring layer 122 is set to keep the temperature of first wiring layer 122 between 660° C. and 1420° C. It is possible to raise the temperature of second wiring layer 126 on crossing portion 134 above 660° C., its melting point, even if insulation layer 124 is inserted between first and second wiring layers 122 and 126. As shown in FIG. 6, second wiring layer 126 on crossing portion 134 is melted by the heat and disconnected. The electrical resistance of second wiring layer 126 changes from that of a short circuit to that of an open circuit, that is, from under 1 ohm before programming to above $10^{10}$ ohms after programming.

Figure 7:
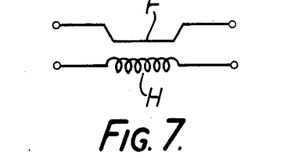
FIGS. 7 and 8 are equivalent circuits illustrating the first embodiment of the fuse device of the present invention, respectively before and after programming.
Figure 8:
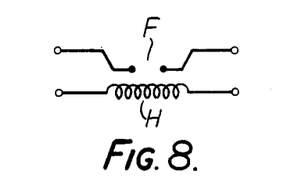
Figure 9:
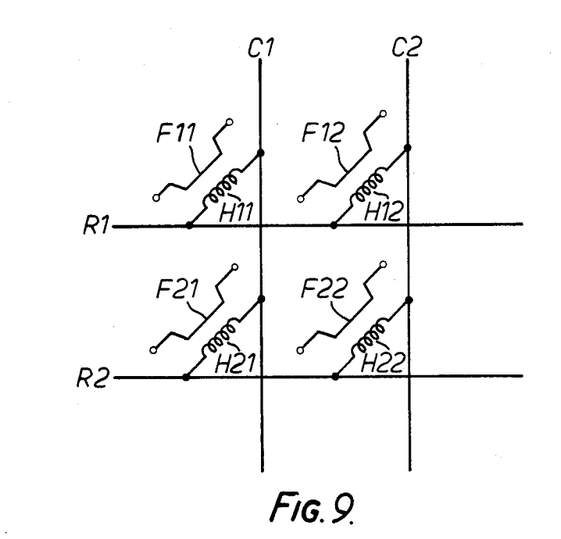
FIG. 9 is an equivalent circuit illustrating a first embodiment of a matrix memory cell array using the fuse device in accordance with the invention.
Figure 10:
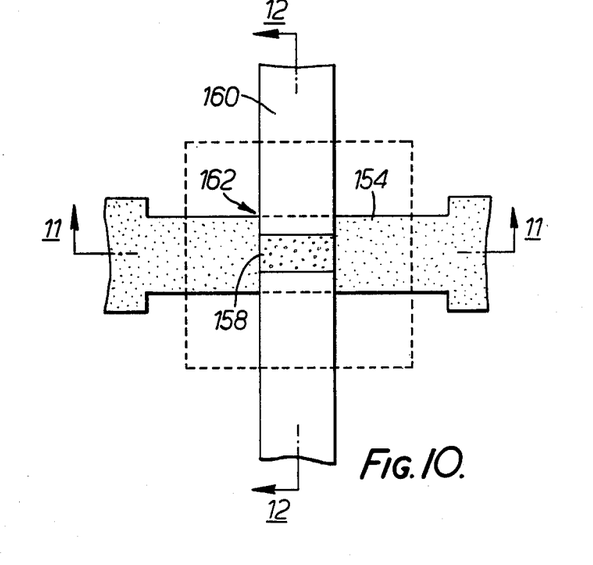
FIG. 10 is a fragmentary top view illustrating a second embodiment of the fuse device structure of the present invention.
Figure 11:
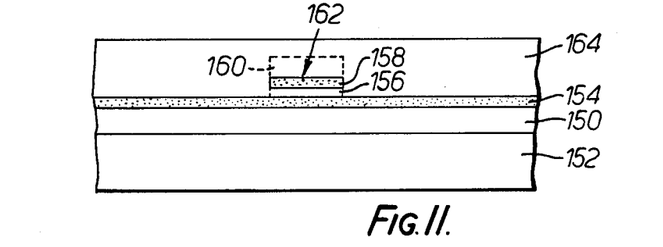
FIG. 11 is a sectional view taken along the 11—11 line in FIG. 10.

Equivalent circuits of a PROM device are shown in FIGS. 7 and 8. The equivalent circuit before programming is shown in FIG. 7 and that after programming is shown in FIG. 8. As shown in FIGS. 7 and 8, programmable fuse device F corresponding to second wiring layer 126 is diconnected by heater H corresponding to first wiring layer 122. It is possible to construct a memory cell array by using a plurality of PROM devices. An embodiment of a memory cell array in which a plurality of PROM devices are arranged as a matrix is shown in FIG. 9. A combination of one of terminals $R_1, R_2 \ldots, R_x$ and one of terminals $C_1, C_2, \ldots, C_y$ is selected when the memory cell is to be programmed. A program voltage is applied between terminals Ri and Cj. The voltage applied to terminals Ri and Cj energizes the heater corresponding to the fuse device being programmed. To apply the voltage, terminals Ri and Cj are respectively connected to supply voltage $V_{DD}$ and ground $V_{SS}$. As a result, a program current passes through a selected heater Hij and heat is generated therein. The heat causes a selected fuse device Fij to be disconnected. Terminals ij1 and ij2 of each fuse device Fij are connected to other circuits of the LSI chip and each fuse device is employed as a memory device.

According to this invention, the fuse device, e.g., second wiring layer 126, is isolated from the heater, e.g., first wiring layer 122, by the insulation layer, e.g., layer 124. Thus the fuse device may be programmed while it is connected to other circuits of the LSI chip, because the program current need not flow into the fuse device itself. Accordingly, this invention is different from the common current fuse type in that the practical application of fuse devices are increased by this invention.

Further, the amount of programming current need be no more than necessary to melt the fuse device by heating. The temperature for melting the fuse device is over 660° C., for example, when the fuse device is made of aluminum. Generally, the melting current is under several mA, which is about one-tenth of the common current fuse type. Accordingly, a high packing density is possible, because the MOS transistor for generating the programming current does not need to pass large driving currents.

Further, thermal damage to other devices around the fuse device may be sufficiently decreased compared with the common device, because the melting point of the fuse device is low.

Accordingly this invention enhances the miniaturization and high packing of PROM devices.

A second embodiment will now be explained in conjunction with FIGS. 10 to 13. As shown in FIGS. 10 to 13, an insulation layer 150 consisting of $SiO_2$ or $Si_3N_4$ is formed on a silicon substrate 152. First wiring layer 154 made of $N^+$ or $P^+$ conductivity type low resistance polycrystalline silicon and having a thickness of about 5000 Angstroms is formed on insulation layer 150. Alternatively, first wiring layer 154 may be made of Mo, Pt, W, Ta or any other metal having a high melting point, the silicide thereof or a single crystalline silicon having an $N^+$ or $P^+$ conductivity type. Insulation layer 156 consisting of $SiO_2$, $Si_3N_4$ or a double layer of both $SiO_2$ and $Si_3N_4$ is formed on first wiring layer 154. The thickness of insulation layer 156 may preferably be between 200 and 1000 Angstroms. A second wiring layer 158, having a thickness of 5000 Angstroms is formed on first wiring layer 154 so as to cross first wiring layer 154 over insulation layer 156. Second wiring layer 158 may be made of high resistivity polycrystalline silicon or any polycrystalline silicon having an N conductivity type. When second wiring layer 158 is formed on first wiring layer 154 at an oblique angle, the electrical characteristic of the fuse device is not changed by it. However, it is reasonable for manufacturing considerations that first wiring layer 154 make a right angle with second wiring layer 158. A third wiring layer 160 is formed on second wiring layer 158. Third wiring layer 160 is disconnected for a desired distance (about 1 micron) on crossing portion 162 of first and second wiring layers 154 and 158. Third wiring layer 160 may be made of aluminum (Al) having a thickness of 8000 Angstroms. If N type polycrystalline silicon is employed as second wiring layer 158, that portion of the silicon near the aluminum forms a P type region. Therefore each portion of third wiring layer 160 forms a PN junction with second wiring layer 158 biased so that no current will flow in either direction in third wiring layer 160.

Second and third wiring layers 158 and 160 are wholly covered with protecting layer 164 for passivation. Protecting layer 164 may be made of phosphorous glass having a thickness of 1 micron, for instance.

Figure 12:
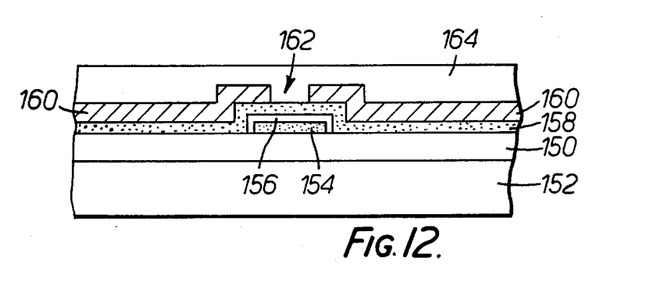
FIG. 12 is a sectional view taken along the 12—12 line in FIG. 10.
Figure 13:
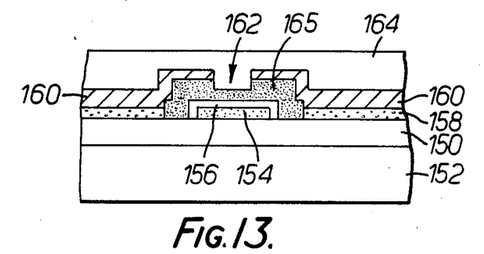
FIG. 13 is a sectional view similar to FIG. 12 illustrating the second embodiment after programming.

The above described programmable fuse device is programmed as follows. As shown in FIG. 12 and FIG. 13, a current of several mA flows through first wiring layer 154. This current generates heat so that first wiring layer 154 is a heater. The generated heat is conducted through insulation layer 156 to second wiring layer 158 on crossing portion 162. The eutectic point of the second and third wiring layers 158 and 160 is 580° C. for silicon and aluminum, which is less than that of first wiring layer 154, 1420° C. for polycrystalline silicon. The amount of current which flows into first wiring layer 154 is set to keep the temperature of first wiring layer 154 between 580° C. and 1420° C. It is possible to raise the temperature of second and third wiring layer 158 and 160 on crossing portion 162 above the eutectic point, even if insulation layer 156 is inserted between first and second wiring layers 154 and 158. As shown in FIG. 13, a eutectic region 164 is made from second and third wiring layers 158 and 160 on and around crossing portion 162. Since eutectic region 164 is formed, the electrical resistance of third wiring layer 160 is changed from that of an opening to that of a short circuit, e.g., from about $10^{10}$ ohms to under about 100 ohms. The electrical resistance ratio before and after programming is more than about $10^8$. Accordingly, third wiring layer 162 may be effectively programmed as the fuse device from an open to a short circuit.

Figure 14:
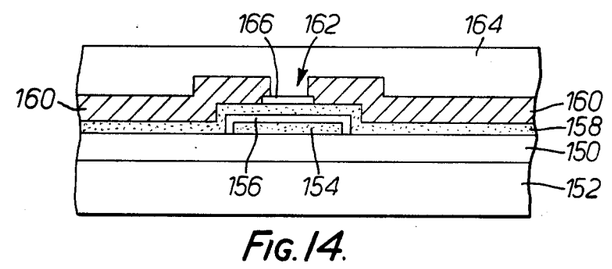
FIG. 14 is a sectional view illustrating a third embodiment of the present invention.

A third embodiment will now be explained with respect to FIG. 14. This third embodiment is different from the second embodiment (shown in FIGS. 10 to 13) in that an insulation film 166 bridges the disconnected portions of third wiring layer 160 on crossing portion 162. The shape of the disconnected portions of third wiring layer 160 is accurately formed by insulation film 166.

Figure 15:
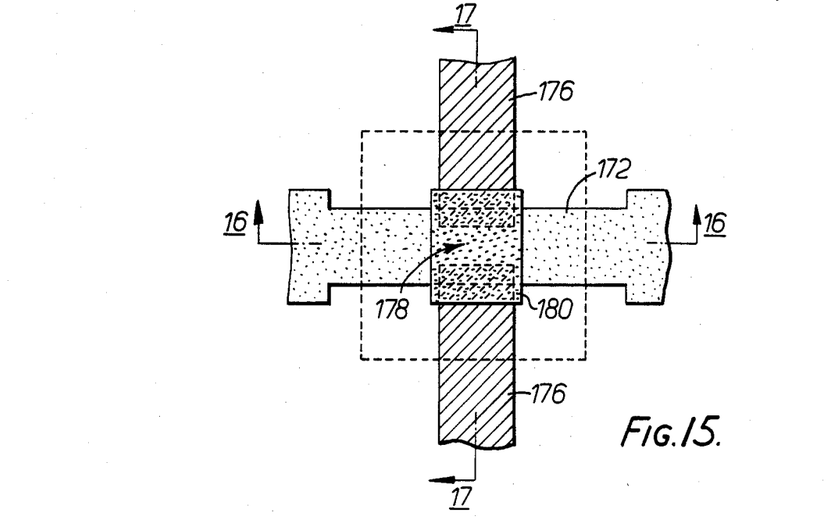
FIG. 15 is a fragmentary top view illustrating a fourth embodiment of the fuse device structure in accordance with the present invention.
Figure 16:
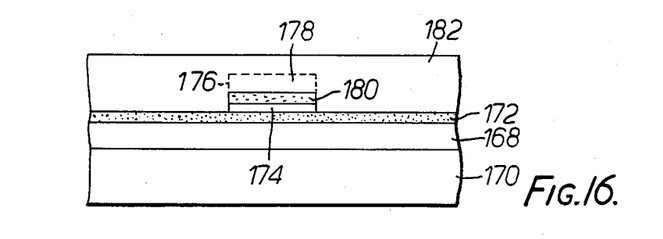
FIG. 16 is a sectional view taken along the 16—16 line in FIG. 15.
Figure 17:
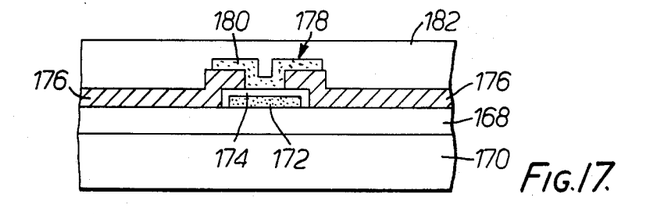
FIG. 17 is a sectional view taken along the 17—17 line in FIG. 15.

A fourth embodiment will now be explained with respect to FIGS. 15 to 18. As shown in FIGS. 15 to 17, an insulation layer 168 consisting of $SiO_2$ or $Si_3N_4$ is formed on silicon substrate 170. First wiring layer 172 made of low resistivity N+ or P+ conductivity type polycrystalline silicon and having a thickness of about 5000 Angstroms is formed on insulation layer 168. Alternatively, first wiring layer 172 may be made of Mo, Pt, W, Ta or any other metal having a high melting point, the silicide thereof or a single crystalline N+ or P+ conductivity type silicon. An insulation layer 174 consisting of $SiO_2$, $Si_3N_4$ or a double layer of both $SiO_2$ and $Si_3N_4$ is formed on first wiring layer 172. The thickness of insulation layer 174 may preferably be between 200 and 1000 Angstroms. A second wiring layer 176 having a thickness of 8000 Angstroms is formed on first wiring layer 172 so as to cross first wiring layer 172 over insulation layer 174. Second wiring layer 176 is disconnected for a desired distance (about 1 micron) on crossing portion 178 of first and second wiring layers 172 and 176. Second wiring layer 176 is made of aluminum and has a thickness of 8000 Angstroms. A third wiring layers 180 is formed to extend over the two disconnected portions of second wiring layer 176 and close to insulation layer 174 and second wiring layer 176 on crossing portion 178. Third wiring layer 180 is made of high resistance amorphous silicon and has a thickness of 8000 Angstroms. Care must be exercised during the deposition of third wiring layer 180 that the temperature of silicon substrate 170 is kept under the eutectic point of second and third wiring layers 176 and 180, which is 580° C. for Al and Si. Second and third wiring layers 176 and 180 are wholly covered with a passivation layer (protecting layer) 182. Protecting layers 182 is made of phosphorous glass of 1 micron thickness, for instance.

Figure 18:
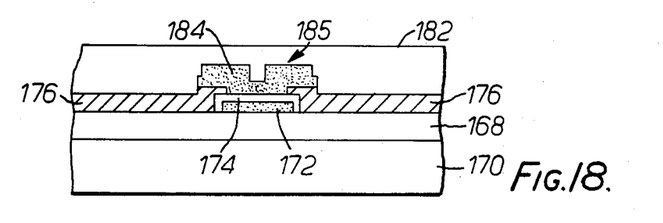
FIG. 18 is a sectional view, similar to FIG. 17, illustrating the fourth embodiment after programming.

As shown in FIGS. 17 and 18, the fuse device is programmed by passing several mA of current through first wiring layer 172 to generate heat. Thus first wiring layer 172 is a heater. The generated heat conducts through insulation layer 174 to second and third wiring layers 176 and 180 on crossing portion 178. The eutectic point of second and third wiring layers 176 and 180 is 580° C. for silicon and aluminum, which is less than the melting point of first wiring layer 172, 1420° C. for amorphous silicon. Accordingly, the amount of current which flows through first wiring layer 172 is set to keep the temperature of first wiring layer 172 between 580° C. and 1420° C. It is possible to raise the temperature of second and third wiring layers 176 and 180, on crossing portion 178 above the eutectic point even when insulation layer 174 is inserted between first and second wiring layers 172 and 176. As shown in FIG. 18, a eutectic region 184 is made from second and third wiring layers 176 and 180 on and around crossing portion 185. Since eutectic region 184 is formed, the electrical resistance of second wiring layer 176 changes from that of an open circuit to that of a short circuit, that is from about $10^{10}$ ohms to under 100 ohms. The ratio of electrical resistance before and after programming is more than about $10^7$ to $10^8$. Accordingly, second wiring layer 176, as the fuse device, is effectively programmed from an open to a short circuit.

Figure 19:
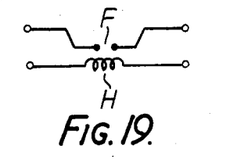
FIGS. 19 and 20 are equivalent circuits illustrating the second to the fourth embodiments before and after programming, respectively.
Figure 20:
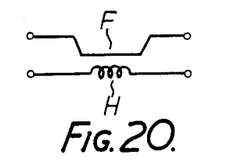
Figure 21:
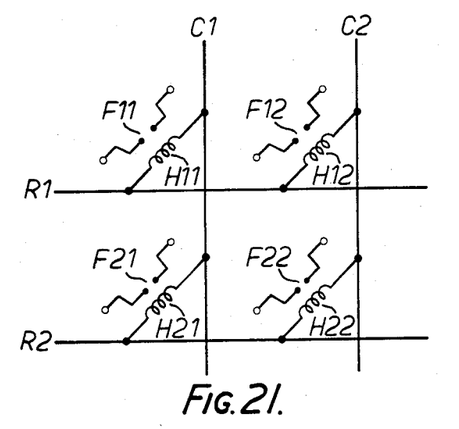
FIG. 21 is an equivalent circuit illustrating the second to the fourth embodiments of this invention in a matrix memory cell array.

FIGS. 19 and 20 are equivalent circuits of a PROM device made in accordance with the second to fourth embodiments. The equivalent circuit before programming is shown in FIG. 19 and the equivalent circuit after programming is shown in FIG. 20. Programmable fuse device F corresponding to the second and third wiring layers, becomes a closed circuit when heater H, corresponding to the first wiring layer is energized. It is possible to construct a memory cell array by using a plurality of PROM devices. An embodiment of a memory cell array in which a plurality of PROM devices are arranged as matrix before programming is shown in FIG. 21. A combination of one of terminals $R_1, R_2 \ldots, R_x$ and one of terminals $C_1, C_2, \ldots, C_y$ are selected when the memory cell is to be programmed. A program voltage is applied between terminals Ri and Cj. The voltage applied to terminals R and Cj energizes the heater corresponding to the fuse device being programmed. To apply the voltage, terminals Ri and Cj are respectively connected to supply voltage $V_{DD}$ and ground $V_{SS}$. As a result, a program current passes through a selected heater Hij and heat is generated therein. The heat causes a selected fuse device Fij to be connected. Terminals ij1 and ij2 of each fuse device Fij are connected to other circuits of the LSI chip and each fuse device is employed as a memory device.

According to this invention, the fuse device, e.g., the second and third wiring layers, is isolated from the heater, e.g., the first wiring layer, by the insulation layer. Thus the fuse device may be programmed while it is connected to other circuits of the LSI chip, for the program current need not flow into the fuse device itself. Accordingly, this invention is different from the common current fuse type in that the degree of design flexibility is increasing by this invention.

Further, the amount of programming current need be no more than necessary to generate the eutectic mixture of the second and third wiring layer by heating the first wiring layer. The temperature for generating the eutectic mixture is over 580° C., for example, when the layers of the fuse device are made of aluminum and polycrystalline silicon. The current for generating such a eutectic mixture is under several milliamperes, which is about one-tenth of the common current fuse type. Accordingly, a high packing density is possible, because the MOS transistor for generating the programming current does not need to pass large driving currents.

Further, thermal damage to other devices around the fuse device may be sufficiently decreased compared with the common device, because the melting point of the fuse device is low. Accordingly, this invention enhances the miniaturization and high packing of PROM devices.

Further, the process of forming the eutectic mixture of the second and third wiring layers is more statically progressed on the physical mechanism than the ordinary process of the current fuse type. Thus it is easy to design the PROM LSI chip.

Moreover, the fuse device may be programmed while the fuse device is covered with the passivation layer (protecting layer). Thus, this device has a higher reliability than the common current fuse device.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A semiconductor device comprising:
   (a) a plurality of first wiring layer means for generating heat by conducting a current therein;
   (b) an insulation layer covering each of said first wiring layer means;
   (c) a second, high resistance wiring layer formed on each said insulation layer;
   (d) an electrically discontinuous third wiring layer formed on each said second wiring layer, each said third wiring layer being made of a low resistance material which forms a low resistance eutectic mixture with a material of said second wiring layer in response to heat generated solely by a corresponding one of said first wiring layer means; and
   means for selectively passing current through any one of said first wiring layer means for causing said eutectic mixture to form corresponding with said second and said third wiring layers.

2. A semiconductor device defined in claim 1 wherein each said first wiring layer means is made of low resistance polycrystalline silicon.

3. A semiconductor device defined in claim 1 wherein each said first wiring layer means is selected from the group consisting of a metal having a high melting point and a silicide of said metal.

4. A semiconductor device defined in claim 1 wherein each said first wiring layer means is made of a single crystal of silicon.

5. A semiconductor device defined in claim 1, 2, 3 or 4 wherein each said second wiring layer is made of high resistance polycrystalline silicon.

6. A semiconductor device defined in claim 1, 2, 3, or 4 wherein each said second wiring layer is made of N conductivity type polycrystalline silicon.

7. A semiconductor device defined in claim 1, 2, 3 or 4 wherein each said third wiring layer is made of aluminum.

8. A semiconductor device defined in claim 1, 2, 3 or 4 wherein each said second wiring layer is disposed transversely to a corresponding said first wiring layer means.

9. A semiconductor device comprising:
   (a) a plurality of first wiring layer means for generating heat by conducting a current therein;
   (b) an insulation layer covering each of said first wiring layer means;
   (c) a second wiring layer formed on each said insulation layer, each said second wiring layer being electrically discontinuous and made of a low resistance material;
   (d) a third, high resistance wiring layer formed on each said second wiring layer, each said third wiring layer being made of a material which forms a low resistance eutectic mixture with said material of said second wiring layer in response to heat generated solely by a corresponding one of said first wiring layer means; and
   means for selectively passing current through any one of said first wiring layer means for causing said eutectic mixture to form corresponding with said second and said third wiring layers.

10. A semiconductor device defined in claim 9 wherein each said first wiring layer means is made of low resistance polycrystalline silicon.

11. A semiconductor device defined in claim 9 wherein each said first wiring layer means is selected from the group consisting of a metal having a high melting point and a silicide of said metal.

12. A semiconductor device defined in claim 9 wherein each said first wiring layer means is made of a single crystal of silicon.

13. A semiconductor device defined in claim 9, 10, 11 or 12 wherein each said third wiring layer is made of high resistance polycrystalline silicon.

14. A semiconductor device defined in claim 9, 10, 11 or 12 wherein each said third wiring layer is made of N conductivity type polycrystalline silicon.

15. A semiconductor device defined in claim 9, 10, 11 or 12 wherein each said second wiring layer is made of aluminum.

16. A semiconductor device defined in claim 9, 10, 11 or 12 wherein each said second wiring layer is disposed transversely to a corresponding said first wiring layer means.

17. A semiconductor device comprising:
(a) a plurality of first wiring layer means for generating heat by conducting a current therein;
(b) an insulation layer covering each of said first wiring layer means;
(c) a second high resistance wiring layer formed on each said insulation layer, each said second wiring layer being disposed transverse to said first wiring layer means to define an overlapping portion of said second wiring layer in which said second wiring layer overlaps said first wiring layer means;
(d) an insulation film formed on each said overlapping portion of each said second wiring layer; and
(e) an electrically discontinuous third wiring layer formed on each said second wiring layer, each said third wiring layer being made of a low resistance material which forms a low resistance eutectic mixture with a material of said second wiring layer in response to heat generated solely by a corresponding said first wiring layer means; and
means for selectively passing current through any one of said first wiring layer means for causing said eutectic mixture to form corresponding with said second and third wiring layers.

18. A semiconductor device defined in claim 17 wherein each said first wiring layer is made of low resistance polycrystalline silicon.

19. A semiconductor device defined in claim 17 wherein each said first wiring layer is selected from the group consisting of a metal having a high melting point and a silicide of said metal.

20. A semiconductor device defined in claim 17 wherein each said first wiring layer is made of a single crystal of silicon.

21. A semiconductor device defined in claim 17, 18, 19 or 20 wherein each said second wiring layer is made of high resistance polycrystalline silicon.

22. A semiconductor device defined in claim 17, 18, 19 or 20 wherein each said second wiring layer is made of N conductivity type polycrystalline silicon.

23. A semiconductor device defined in claim 17, 18, 19 or 20 wherein each said third wiring layer is made of aluminum.

* * * * *